United States Patent [19]
Dasgupta

[11] Patent Number: 6,052,011
[45] Date of Patent: Apr. 18, 2000

[54] FRACTIONAL PERIOD DELAY CIRCUIT

[75] Inventor: Uday Dasgupta, Singapore, Singapore

[73] Assignee: Tritech Microelectronics, Ltd., Singapore, Singapore

[21] Appl. No.: 08/966,736

[22] Filed: Nov. 10, 1997

[51] Int. Cl.[7] .................................................. H03H 11/26
[52] U.S. Cl. ......................... 327/270; 327/244; 327/245
[58] Field of Search .................................... 327/270, 271, 327/272, 274, 276, 277, 278, 280, 284, 285, 287, 288, 281, 237, 243, 244, 245, 258, 147, 149, 156, 158

[56] References Cited

U.S. PATENT DOCUMENTS

| | | | |
|---|---|---|---|
| 3,590,280 | 6/1971 | Hudson et al. | 307/269 |
| 3,961,269 | 6/1976 | Alvarez, Jr. | 328/62 |
| 5,103,114 | 4/1992 | Fitch | 307/271 |
| 5,184,027 | 2/1993 | Masuda et al. | 307/269 |
| 5,532,633 | 7/1996 | Kawai | 327/174 |
| 5,594,376 | 1/1997 | McBride et al. | 327/326 |
| 5,815,017 | 9/1998 | McFarland | 327/158 |

*Primary Examiner*—Kenneth B. Wells
*Assistant Examiner*—Hai L. Nguyen
*Attorney, Agent, or Firm*—George O. Saile; Stephen B. Ackerman; Billy Knowles

[57] ABSTRACT

A fractional period delay circuit to delay a clocking signal by a non-integer fraction of the period of the clocking signal is disclosed. The fractional period delay circuit has a first delay line connected to a master timing signal to delay the master clock to form the first timing signal. The fractional period delay circuit has plurality of adjustable delay lines. Each adjustable delay line is connected to the master timing signal to delay the master timing A delay adjustment input will modify the delay of the adjustable delay circuit. The fractional period delay circuit further has a plurality of phase difference detectors connected to the output of the first delay line and to the output of one of the plurality of adjustable delay lines. The phase difference detector will create a difference signal indicating a difference in phase between the first timing signal and one of the delayed timing signals. A plurality of sequence timing signals are created in a is timing sequence generator. A phase correction calculators is connected to a phase difference detector and the timing sequence generator to calculate a delay adjustment signal. The delay adjustment signal is an error signal indicating the delay between the delayed timing signal and the first timing signal. The delay adjustment signal is transferred to a delay line adjustment circuit to adjust the delay of the adjustable delay line.

18 Claims, 11 Drawing Sheets

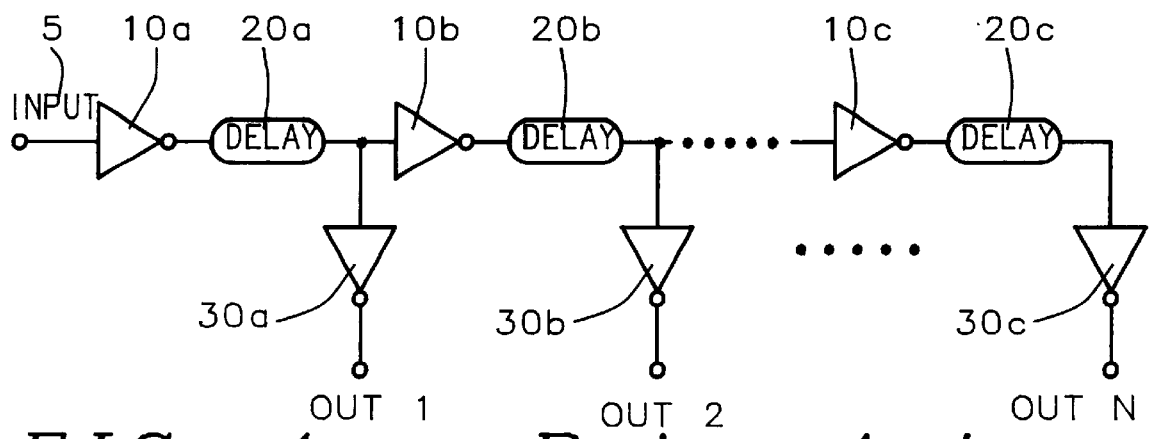
FIG. 1a – Prior Art
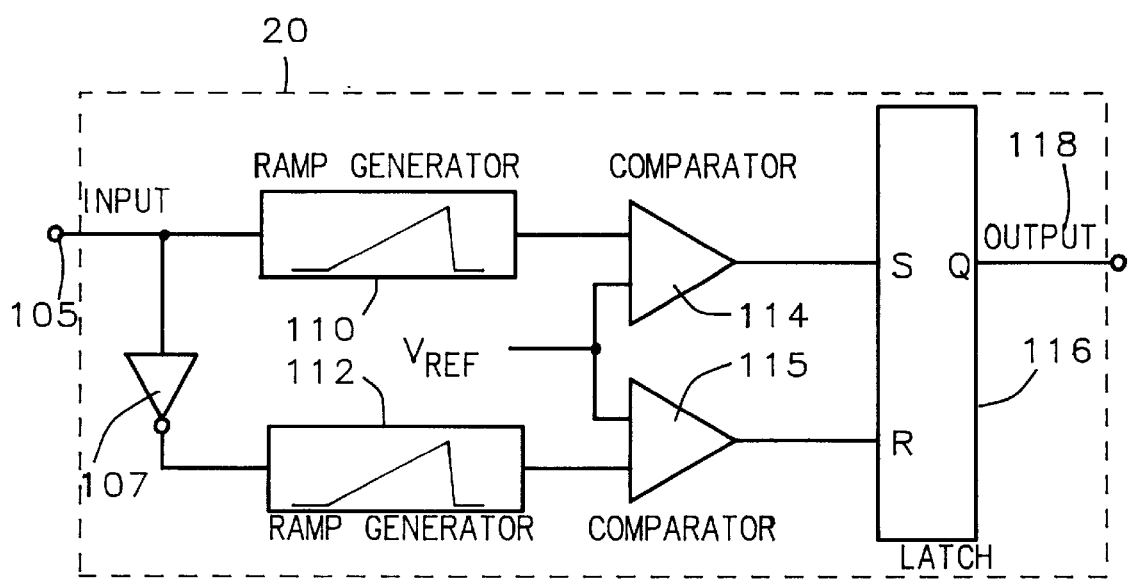
FIG. 1b – Prior Art
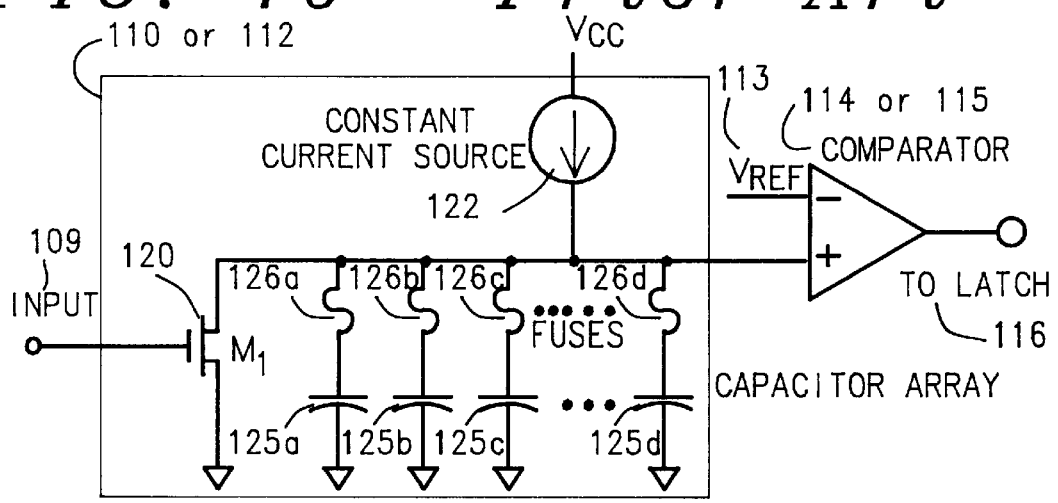
FIG. 1c – Prior Art

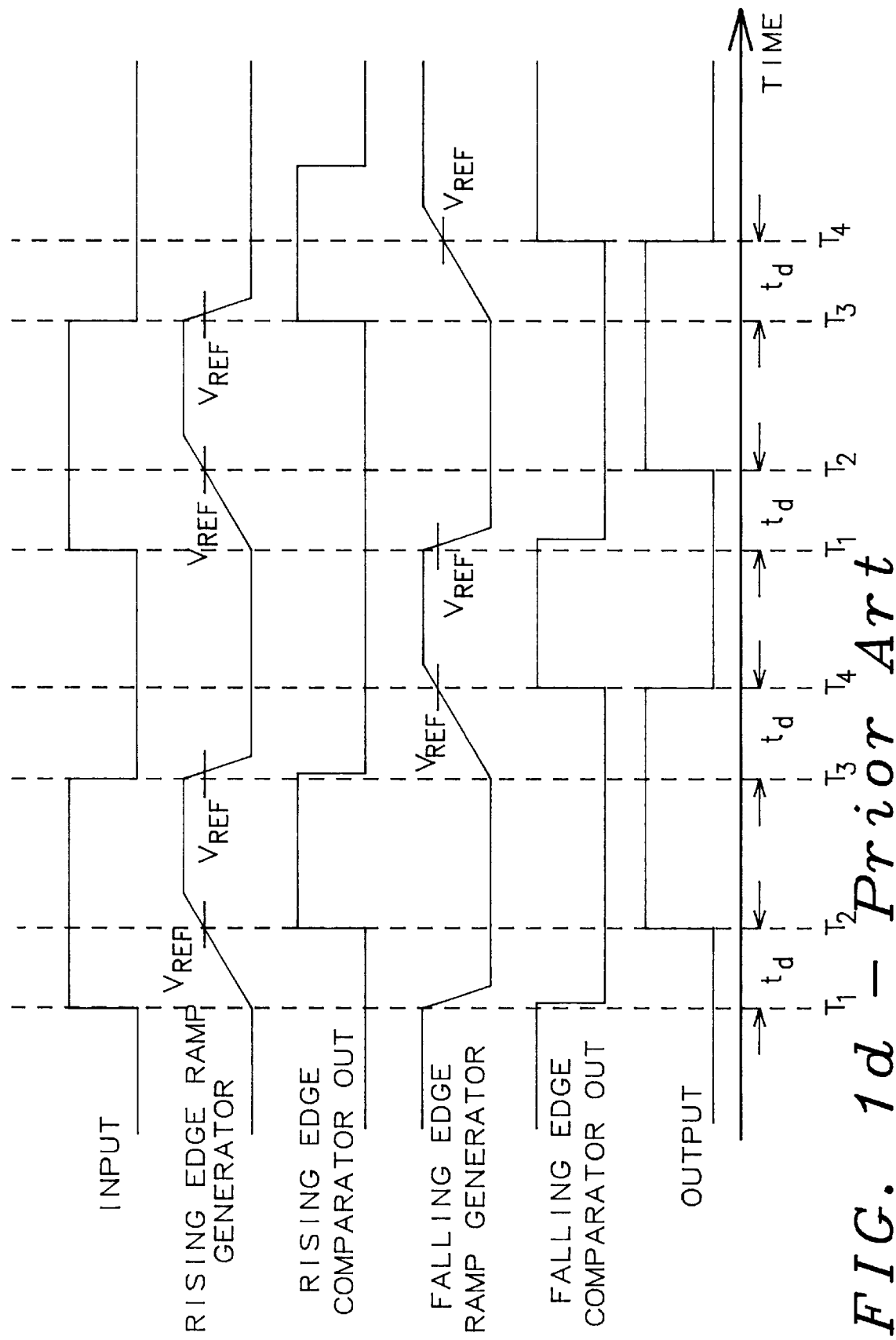
FIG. 1d – Prior Art

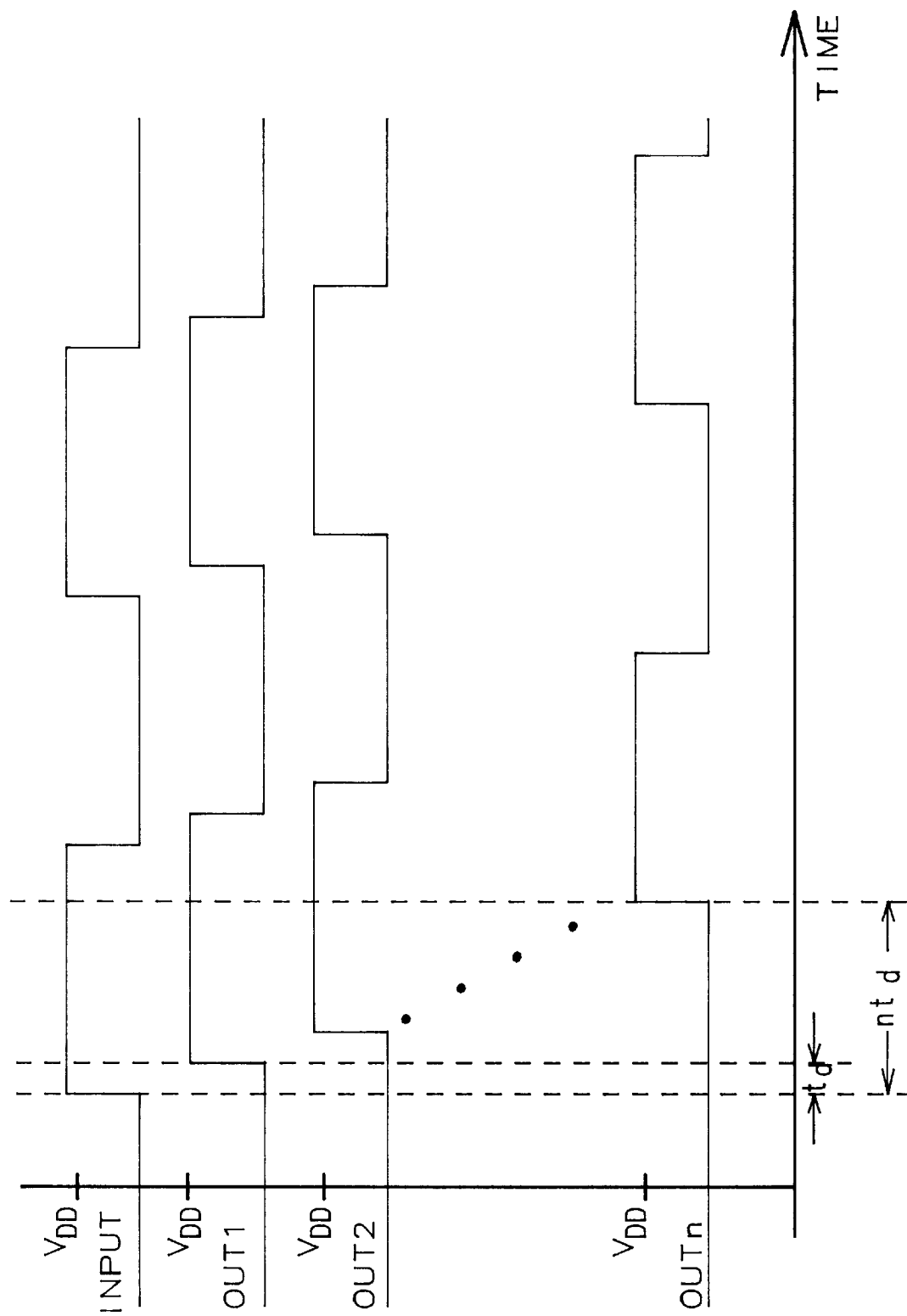
FIG. 1e – Prior Art

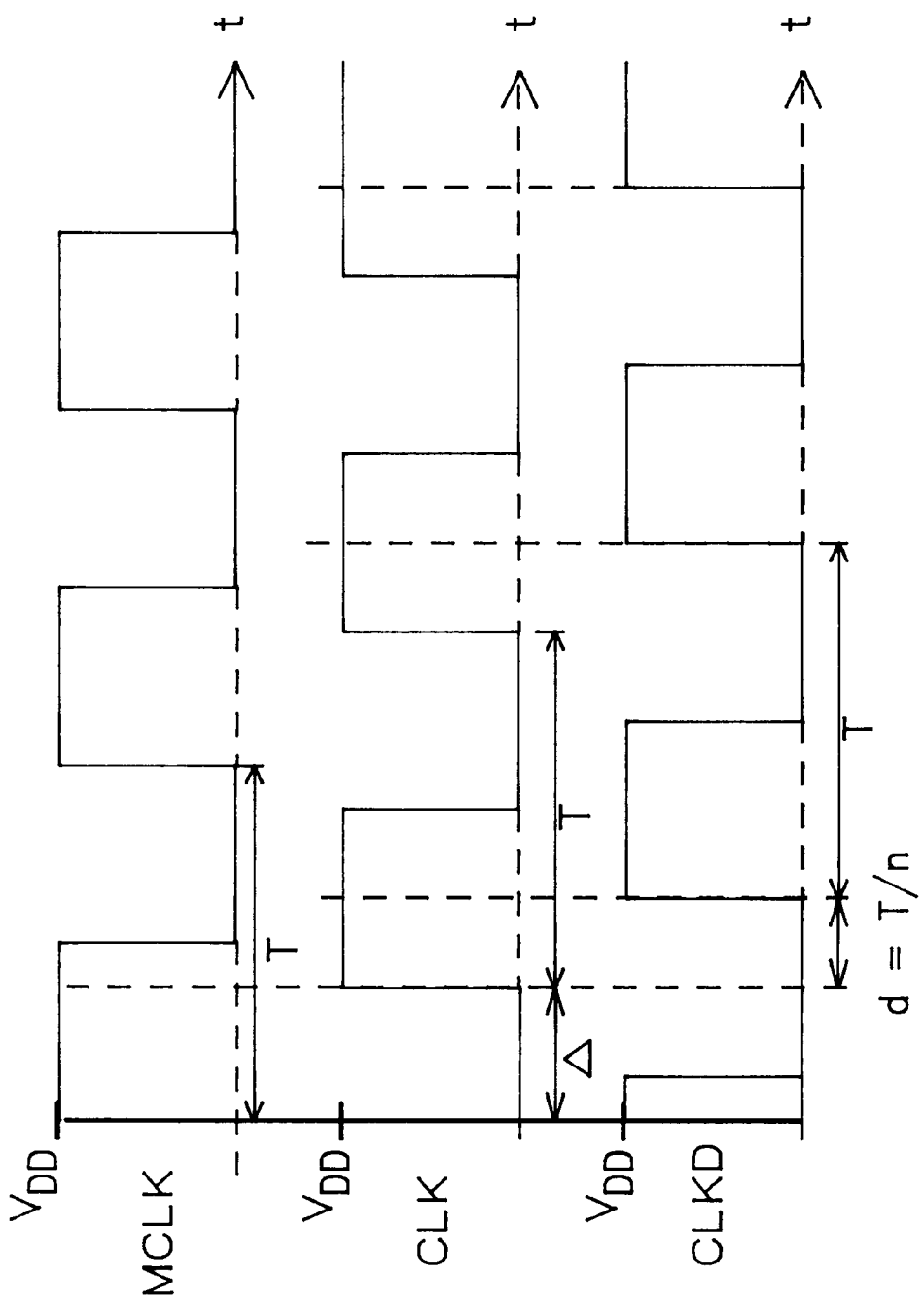
FIG. 1f – Prior Art

FRACTIONAL PERIOD DELAY CIRCUIT

BACKGROUND OF THE INVENTION

1. Field of the Invention

This invention relates to electronic timing circuits and more particularly to circuits that will delay timing signals precisely and continuously with respect to another timing signal.

2. Description of Related Art

Delay lines and silicon delay circuits are well known in the art. Delay lines generally are circuits composed of resistors, capacitors and/or inductors coupled to semiconductor amplifiers or buffers. The signal at the output of the delay line will be delayed by a period of time determined by the reactances of the resistive, capacitive, and/or inductive circuit.

Most delay lines currently are hybrid circuits that are not capable of integration on semiconductor chips.

Silicon delay circuits, while often termed silicon delay lines, are often formed of a chain of simple inverter circuits. The total delay of the chain will be the composite delay of the individual inverter circuits.

A second silicon delay circuit is a silicon timed circuit such as the DS1000-20 from Dallas Semiconductor Corporation, Dallas, Tex. Refer now to FIGS. 1a–1e to discuss the operation of the silicon delay line or silicon timed circuit. An input 5 is connected to an inverting buffer 10a. The output of the inverting buffer 10a is connected to the delay element 20a. As a signal is placed at the input 5, it is inverted and buffered by the inverting buffer 10a. The signal at the output of the inverter buffer 10a is then delayed by some period of time $t_d$ before being available at the output terminal of the delay element 20a. The output terminal of the delay element 20a will be connected to the input of the inverter buffer 30a. The output of the inverter buffer 30a will have the output signal OUT1. Referring now FIG. 1e, it can be seen that output OUT1 is a replica of the input 5 except delayed by a period of time $t_d$.

The output of the delay element is, also, the input to the inverter buffer 10b and the output of the inverter buffer 10b is the input to the delay element 20b. Delay element 20b, like delay element 20a, will delay a signal placed at it input by a period of time $t_d$. The output of the delay element 20b is the input of the inverter buffer 30b. The output of the inverter buffer 30b will be the signal OUT2. As can be seen from FIG. 1e, the signal OUT2 will be a replica of the input signal delayed by a time period that is twice the delay period $t_d$.

A delay segment is composed of the inverter buffer such as inverter buffer 10b, a delay element such as delay element 20b, and an inverter buffer 30b. Multiple delay segments will be serially linked. The last delay segment of a multiple tapped delay line will be the delay segment that has the inverter buffer 10c, the delay element 20c, and the inverter buffer 30c. The output of the inverter buffer 30c will form the output signal OUTn. The digit n indicates the number of delay segments in the multitapped silicon delay line. In the example of the DS1000-20, the number n of delay segments is five and the delay $t_d$ per segment is 4 nsec.

In most delay lines the time delay per segment is nominally equal, with the variation being only due to process variation. This allows for a multiple phased clocking as shown in FIG. 1e to be generated. Each output phase OUT1, OUT2, . . . , OUTn is formed by delaying the input signal by the delay of each delay segment to form each phase of the clock.

The delay elements 20a, 20b, and 20c are illustrated in FIG. 1b as the delay element 20. The input 105 is applied to the rising edge ramp generator 110 and is inverted by inverter buffer 107 and applied to the falling edge ramp generator 112. The output of the rising edge generator 110 is the input to the noninverting terminal of the rising edge comparator 114. The output of the falling edge ramp generator 112 is the input to the noninverting input of the falling edge comparator 115.

The inverting inputs of the rising edge and falling edge comparators 114 and 115 are connected to a reference voltage source $V_{ref}$. The output of the rising edge comparator 114 is connected to the set input s of the latch 116 and the output of the falling edge comparator 115 is connected to the reset input r of the latch 116.

The outputs of the rising edge comparator 114 or the falling edge comparator 115 will respectively change from a first logic level (0) to a second logic level (1) when the voltage of the output of the rising edge ramp generator 110 or the falling edge ramp generator 112 have exceeded the voltage level of the reference voltage source $V_{ref}$. Conversely, when the voltage level of the input of the rising edge ramp generator 110 or the falling edge ramp generator 112 is less than the voltage level of the reference voltage source $V_{ref}$, the output of the rising edge comparator 114 or the falling edge comparator 115 will change from the second logic level (1) to the first logic level (0).

The output Q of the latch 116 will be set to the second logic level (1) if the set s of the latch 116 is brought to the second logic level (1), while the reset input r remains at the first logic level (0) and the output Q of the latch 116 will assume the first logic level (0) when the reset input r is brought to the second logic level (1) and the set input s is brought to the first logic level (0).

Refer now to FIG. 1c to understand the operation of the rising edge and falling edge ramp generators 110 and 112. The rising edge and falling edge ramp generators 110 and 112 each have an input 109 connected to the gate of the metal oxide semiconductor (MOS) transistor $M_1$ 120. The source of the MOS transistors $M_1$ 120 is connected to the ground reference point and the drain is connected to the output of the output of the ramp generators 110 or 112. The constant current source 122 is connected between the power supply voltage source $V_{CC}$ and the output of the ramp generators 110 or 112. Optionally, fuses 126a, 126b, 126c, and 126d each connect the first plate of one of the array of capacitors 125a, 125b, 125c, and 125d to the output of the ramp generators 110 or 112. If the fuses 126a, 126b, 126c, and 126d are not used the first plate of the capacitor 125a, 125b, 125c, and 125d will be attached to the output of the ramp generators 110 or 112, and the delay of the delay elements will be fixed.

The fuses 126a, 126b, 126c, and 126d, if implemented, will be used to select the appropriate capacitor or capacitors of the array of capacitors 125a, 125b, 125c, and 125d. This will set the delay of the delay element as the capacitors 125a, 125b, 125c, and 125d are selected.

When the input 109 of the ramp generator 110 or 112 is at the first logic level (0), the MOS transistor $M_1$ will not be conducting. The constant current source 122 will be charging the capacitors 125a, 125b, 125c, and 125d. The voltage (V) at the output of the ramp generators 110 or 112 will be:

$$V = \frac{IT}{C}$$

where:

I is the current through the constant current source 122.

T is the time elapsed from the time the signal at the input 109 assumed the first logic level (0).

C is the capacitance of the capacitor array 125a, 125b, 125c, and 125d.

When the input 109 is at the second logic level (1), the MOS transistor $M_1$ 120 is conducting. The voltage at the output of the ramp generators 110 or 112 will fall from the voltage described above toward the level of the ground reference point. The time for this change will depend on the drain to source resistance of the MOS transistor $M_1$ 120 and the value of the capacitance of the capacitor array 125a, 125b, 125c, and 125d.

Refer now to FIG. 1d, for a detailed description of the voltage waveforms detailing the operation of the delay element 20 of FIG. 1b. The input to the delay element will change from the first logic level (0) to the second logic level (1) at time $T_1$. At this time, the output of the rising edge ramp generator will begin to rise as described in FIG. 1c. Once the voltage level of the output of the rising edge voltage generator attains the level of the reference voltage source $V_{ref}$ at time $T_2$, the rising edge comparator will change from the first logic level (0) to the second logic level (1). The output of the latch will be set from the first logic level (0) to the second logic level (1). The time difference from time $T_1$ to time $T_2$ will be the delay time $t_d$.

At time $T_3$, the input will change from the second logic level (1) to the first logic level (0). At this time, the voltage level at the output of the rising edge generator will start to fall relatively rapidly. When the voltage level at the output of the rising edge ramp generator falls to a level less than that of the reference voltage source $V_{ref}$, the output of the rising edge comparator changes from the second logic level (1) to the first logic level (0).

At this same time $T_3$, the voltage level of the output of the falling edge ramp generator begins to rise. When the voltage level of the output of the falling edge ramp generator attains the level of the voltage of the reference voltage source $V_{ref}$, the output of the falling edge comparator will change from the first logic level (0) to the second logic level (1) thus resetting the output of the latch from the second logic level (1) to the first logic level (0). At time $T_4$, the output of the latch will be reset thus changing from the second logic level (1) to the first logic level (0). The time difference from time $T_3$ to time $T_4$ is the delay time $t_d$.

At the next cycle $T_1$, as the input changes from the first logic level (0) to the second logic level (1), the voltage level of the falling edge ramp generator will ball rapidly. As the voltage level of the falling edge ramp generator surpasses the voltage level of the reference voltage source, the falling edge comparator will change from the second logic level (1) to the first logic level (0). The changing of the rising edge comparator from the second logic level (1) to the first logic level (0) at time $T_3$ and the falling edge comparator the second logic level (1) to the first logic level (0) at time $T_1$, ensures that the latch will never have a set s and a reset r simultaneously at the second level (1) thus creating a metastable condition.

While silicon delay lines as described above are able to be integrated easily on a semiconductor wafer, they do not allow for modification of the delays $t_d$ of the individual delay times $t_d$ of the individual elements.

Referring now to FIG. 1f to examine a situation found developing the timing and clocking for microprocessors and digital signal processors. A master clock MCLK will have a period T. Within the circuit for which the master clock MCLK is providing the timing, a portion of that circuit may require a first clock CLK that has a time delay Δ from the master clock MCLK and a second clock CLKD that has a time delay d from the first clock CLK. The time delay d is a fractional amount of the period or $$d = \frac{T}{n}$$

where:

d is the time delay of the second clock CLKD from the first clock CLK.

T is the period of the master clock MCLK, the first clock CLK, and the second clock CLKD.

n is the fractional amount of the delay of the period T, and is a positive number greater than unity.

Generally, delay d is a 90° phase shift or one quarter of the time T, or in the case with multitapped silicon delay lines, as described above, the increments will be fixed and not adjustable for the requirements of the master clock MCLK.

U.S. Pat. No. 5,103,114 (Fitch) teaches a circuit to develop a clock of a specified duty cycle using standard digital delay lines.

U.S. Pat. No. 5,532,633 (Kawai) discloses a clock generating circuit to generate multiple non-overlapping clock signals. A fundamental clock is delayed to form multiple delayed fundamental clocks. The final delayed fundamental clock is the input to a frequency divider. The frequency divided clock is logically combined with the fundamental clock to form the non-overlapping clock signals.

U.S. Pat. No. 3,961,269 (Alvarez) discloses a multiple phase clock generator that will create multiple phase clocks from a single phase clock. The single phase clock is inverted to provide two complementary signals. The two complementary signals are each one of the inputs to two push-pull amplifiers. The outputs of the push-pull amplifiers are cross-coupled as input to a logic gate that logically combines the output of the cross-coupled amplifier with the opposite phase of the complementary clock to drive a second input of the push-pull amplifier. By judicious selection of the operating parameters, the desired separation and the shape of the two clock phases can be attained.

U.S. Pat. No. 3,590,280 (Hudson et al.) illustrate another design of a multiphase clock. The multiphase clock is derived from a single phase clock and has remotely controllable variable pulsewidths and variable phase shifts. J-K flip-flops and a MOS transistor with resistors and capacitors are utilized to form a monostable multivibrator. The phase can be adjusted by a computer connected to a digital-to-analog converter. The outputs of the digital-to-analog converter are connected to the gates of the MOS transistor to control the timings of the monostable multivibrator.

SUMMARY OF THE INVENTION

An object of this invention is to provide a time delay circuit that can be integrated upon a semiconductor wafer.

Another object of this invention is to provide a time delay circuit that will generate a time delay that is a non-integer fraction of a period of a clocking signal.

To accomplish these and other objects a fractional period delay circuit has a first delay line. The first delay line has an input connected to a master timing signal, a delay circuit connected to the input to delay the master timing signal to form the first timing signal, and an output connected to the delay circuit to transfer the first timing signal to subsequent circuitry.

The fractional period delay circuit has plurality of adjustable delay lines. Each adjustable delay line has an input connected to the master timing signal, an adjustable delay circuit to delay the master timing signal, a delay adjustment input connected to the adjustable delay circuit to modify a delay parameter of the adjustable delay circuit, and an output connected to the adjustable delay circuit to transfer the delayed timing signal to subsequent circuitry.

The fractional period delay circuit further has a plurality of phase difference detectors. Each phase difference detector has a first input connected to the output of the first delay line, a second input connected to the output of one of the plurality of adjustable delay lines, a difference circuit to create a difference signal indicating a difference in phase between the first timing signal and the one delayed timing signal, and an output to transfer the difference signal.

Further, the fractional period delay circuit has a timing sequence generator connected to the output of the first delay line to create a plurality of sequence timing signals.

Additionally the fractional period delay circuit has a plurality of phase correction calculators. Each phase correction calculator is connected to one of the plurality of phase difference detectors and the timing sequence generators to calculate a delay adjustment signals that will maintain a correct delay signal indicating an error between the delayed timing signal and the first timing signal.

Finally the fractional period delay circuit has a plurality of delay line adjustment circuits. Each delay line adjustment circuit is connected to one of the plurality of phase correction calculators and to the delay adjustment input of one of the adjustable delay lines to adjust the delay of the adjustable delay line such that the one delay timing signal is correctly delayed with respect to the first timing signal.

BRIEF DESCRIPTION OF THE DRAWINGS

FIGS. 1a–1e describe the operation of a silicon delay line of the prior art.

FIG. 1f is a timing diagram of a multiple phased clock of the prior art.

DETAILED DESCRIPTION OF THE INVENTION

Figure 2A:
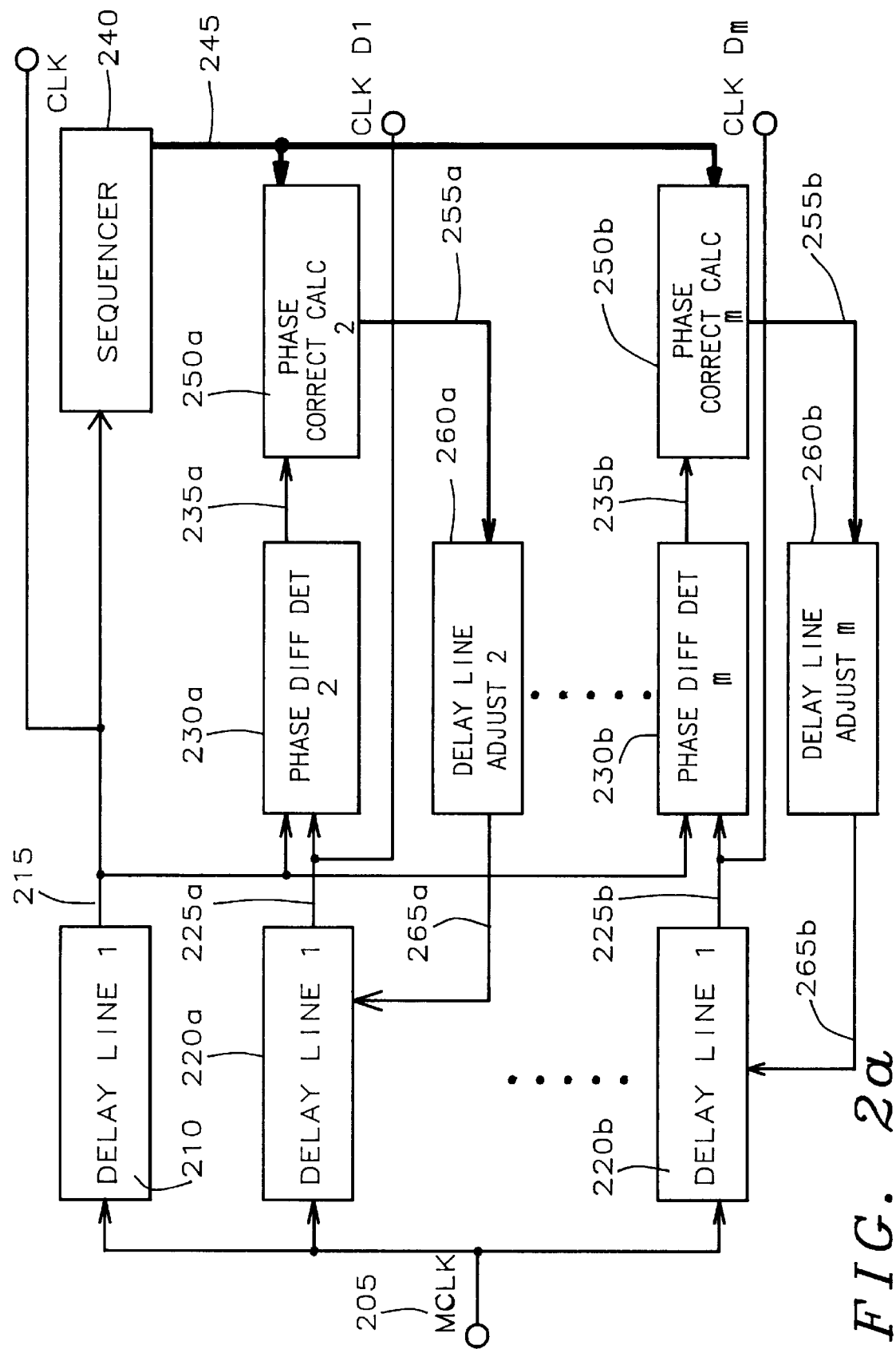
FIG. 2 is a schematic diagram of a fractional period delay clock generation circuit of this invention.
Figure 2B:
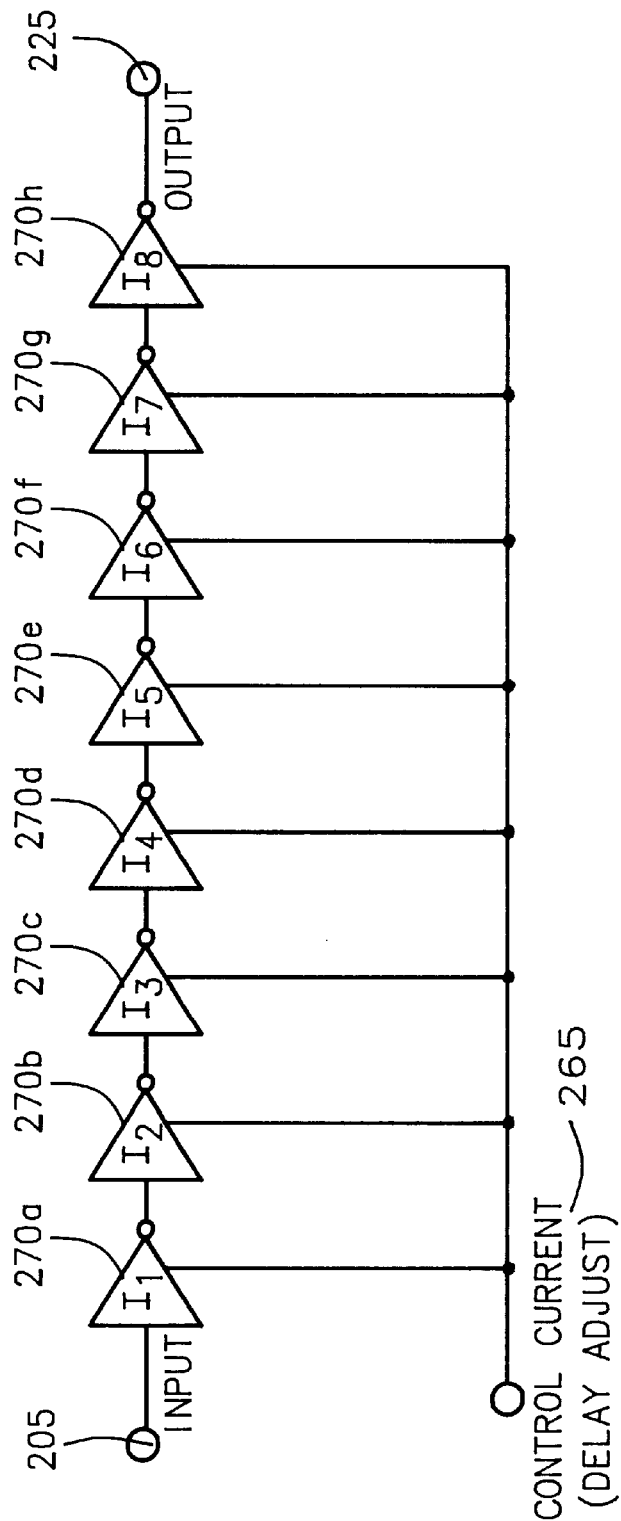

To understand the general operation of fractional period delay circuits of this invention as used to develop multiple phased timing signals, refer now to FIG. 2. The master clock signal 205 is connected to the first delay line circuit 210. The first delay line circuit 210 will be functionally similar to the delay element described in FIG. 1b, but can be simpler, a cascade of inverters for example as shown in FIG. 2b. The output 215 of the first delay circuit 210 will be the first timing signal CLK. The first timing signal CLK will be delayed from the master clock signal 215 by a time period A as shown in FIG. 1f. The time period Δ is not the important parameter for this invention only the relative phases of the timing signals CLK CLKD1, . . . , CLKDn are accurately determined.

The master clock is also connected to the second delay line 220a through the nth delay line 220b. The second delay line 220b to the nth delay line 220c will be as shown in FIG. 2b. The delay line used in FIG. 2b will be functionally is similar to that described in FIG. 1b except the delay for the delay element shown can be modified by the delay adjustment line 265. The delay will be formed as the cascade of the inverters 270a, . . . ,270h. The input 205 will be the Mclk 205 of FIG. 2a and delayed by the inverters 270a, . . . ,270h to form the output 225 which is a delayed form to the input 205 similar to the signals of FIG. 1f.

Referring back to FIG. 2a, the outputs 225a . . . , 225b of the second delay line 220a through the nth delay line 220b, each form the delayed clock signals CLKD1, . . . , CLKDn. Each delay of the second delay line 220a through the nth delay line 220b is adjusted from the first clocking signal CLK such that any delays of the clocks CLKD1, . . . , CLKDn with respect to the first clocking signal CLK can be accurately determined.

The delay time of each of the delay lines 220a, . . . , 220b will be determined, and will be as shown as in FIG. 1f.

The output 215 of the first delay line 210 will be an input to the phase difference detectors 230a, . . . , 230b. A second input of each of the phase difference detectors 230a, . . . , 230b will be the corresponding output 225a, 225b of the delay lines 220a, . . . , 220b. The phase difference detectors 230a, . . . , 230b will each have on output 235a, . . . , 235b that will be at the second logic level (1) for a period of time indicating the actual time delay of each of the delay lines 220a, . . . , 220b.

Figure 4:
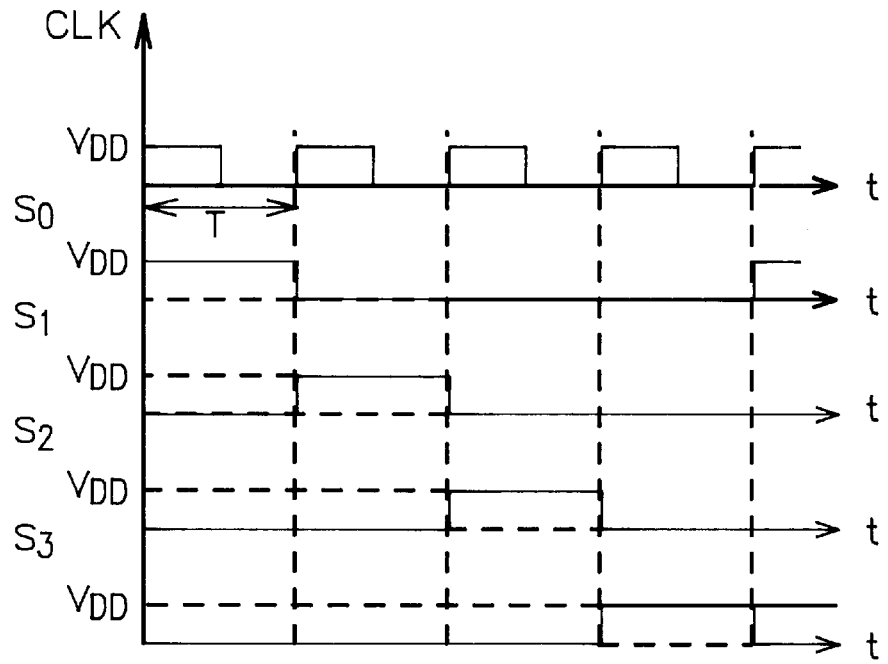
FIG. 4 is a timing diagram of the sequencer circuit of a fractional period delay clock generation circuit of this invention.

The output 215 of the first delay line 210 is the input to the sequencer 240. The sequencer 240 will generate a series of sequence control signals $S_0, S_1, S_2, S_3$ 345 that are shown in FIG. 4. The sequence control signals will be placed at the output 245 of the sequencer 240.

The output 245 of the sequencer 240 will provide the sequence control signals as input to the phase correction calculators 250a, . . . , 250b. The phase correction calculators 250a, . . . , 250b will determine the correction factor necessary to modify the delay of the delay lines 225a, . . . , 225b such that the actual delay of the delay lines 225a, . . . , 225b is the desired delay of the delayed clocks CLKD1, . . . , CLKDn from m the first clock CLK.

The phase correction factor will be output signal 255a, . . . , 255b of each of the phase correction calculators 250a, . . . , 250b. Each phase correction factor will be an input to each delay line adjustment circuit 260a, . . . , 260b. Each delay line adjustment circuit 260a, . . . , 260b will change the delay of each of the delay lines 220a, . . . , 220b according the phase correction factor. The delay of each delay line 220a, . . . , 220b will be modified by changing the control current (delay adjust) 265 as shown in FIG. 2b. The modification as implemented in the preferred embodiment is hereinafter described.

A feedback loop is established and maintained by each phase difference detector 230a, ..., 230b, each phase correction calculator 250a, ..., 250b and each delay line adjustment circuit 260a, ..., 260b. The feedback loop will change each adjustable delay line 220a, ..., 220b to have the appropriate delay with respect to that of the first delay line 210, which is a fractional portion of the period of the first clock CLK.

Figure 3:
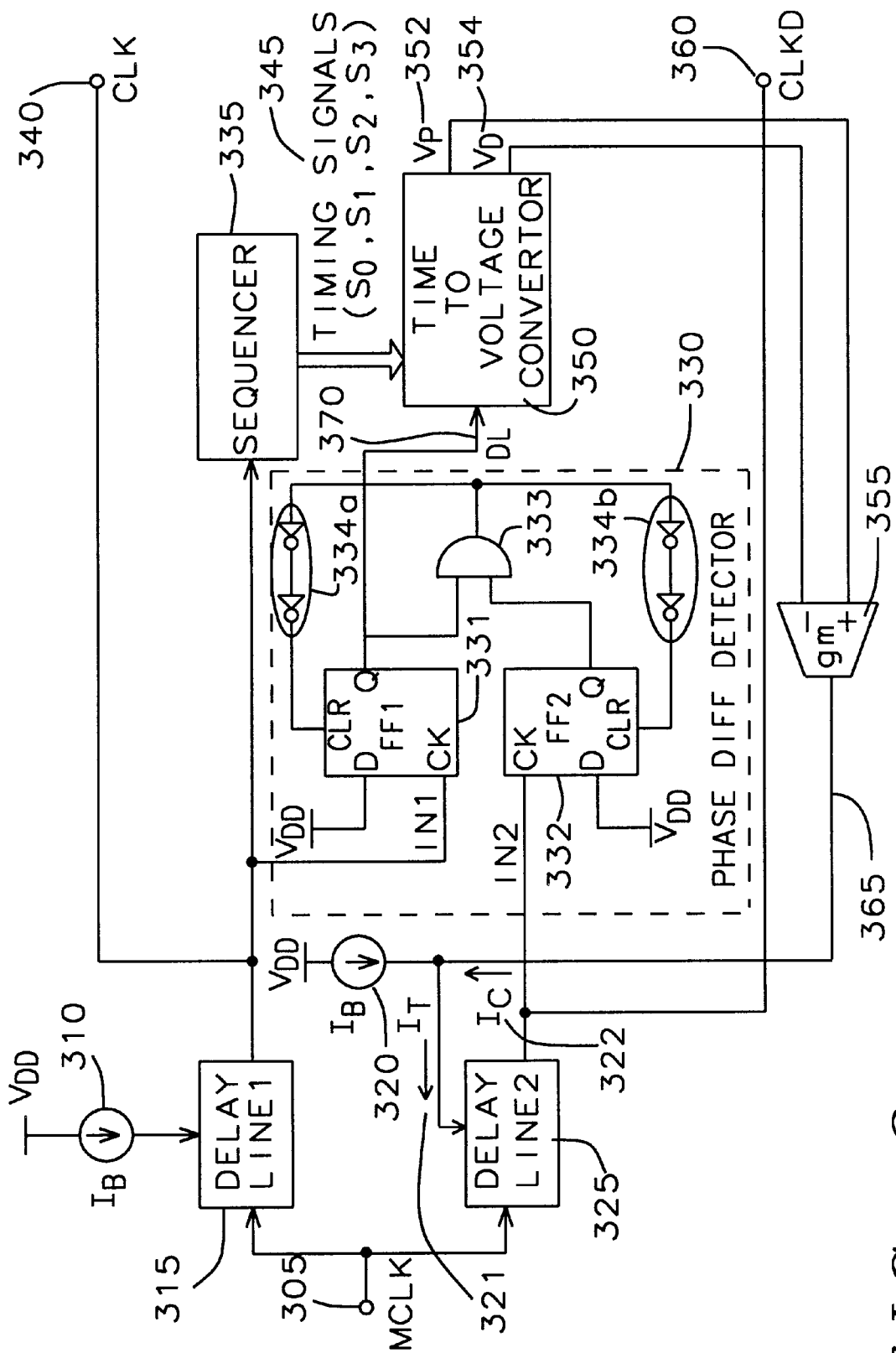
FIG. 3 is a schematic diagram of a preferred embodiment of a fractional period delay clock generation circuit of this invention.

Refer to FIG. 3 for a description of the preferred embodiment of this invention. The master clock 305 has a waveform that is equivalent to the master clock MCLK of FIG. 1f as an input. The master clock 305 is an input to the first delay line 315. The output of the first delay line 315 will for the first clock signal 340. The first clock signal 340 is delayed by a period of time Δ as shown in FIG. 1F. The period of time Δ is not important to the operation of this invention and is not accurately controlled.

The first delay line 315 has a constant current source 310 that will control the time delay of the first delay line 315. This control is similar to the control current (delay adjust) 265 as described in FIG. 2b.

The master clock 305 is also an input to the second delay line 325. The output of the second delay line 325 is the delayed clock 360. The delayed clock 360 is equivalent to the delayed clock CLKD of the FIG. 1f. The delayed clock 360 will be delayed from the first clock signal 340 by the delay factor d of FIG. 1f. The first delay line 315 and the second delay line 325 have and identical circuit as described in FIG. 2b. The different values of control current $I_b$ 310 and $I_T$ 321 causes the first delay line 315 and the second delay line 325 to have a different delay amount. The control current for the first delay line is strictly Ib 310 and the control current for the second delay line 325 is $I_T$ 321 where $$I_T = I_B + I_C$$

The delay factor will be controlled by the delay adjustment block 355. The delay adjustment block 355 will add current to $I_C$ 322 or subtract current $I_C$ 322 from the second delay line that is provided by the constant current source 320.

Figure 5:
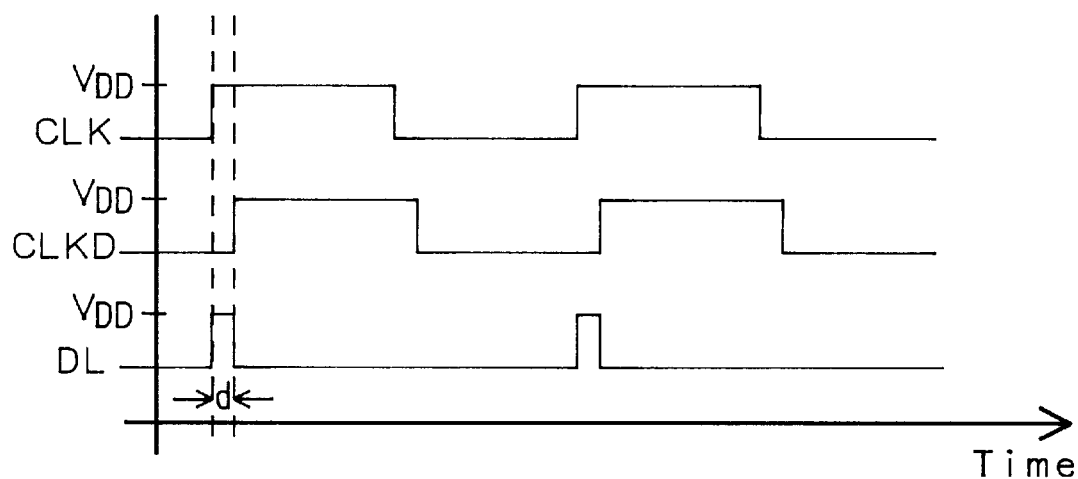
FIG. 5 is a timing diagram of the phase difference detector of a fractional period delay clock generation circuit of this invention.

The phase difference detector 330 will detect the difference in phase or the delay between the first clock 340 and the delayed clock 360. The output of the phase difference detector will be a pulse of the second logic level (1) for a period of time representing the phase difference or delay between the first clock 340 and the delayed clock 360. This can be seen in FIG. 5. The delay signal 370 will have a logic level approaching that of the power supply voltage source for the period of time representing the phase difference or the delay between the first clock CLK and the delayed clock CLKD.

Returning to FIG. 3, the phase difference detector 330 is composed of two Flip-Flops 331 332, an AND gate 333, and two buffers 334a 334b. The clock CLK input of the first Flip-Flop 331 is connected to the output 340 of the first delay line 315 and the clock CLK input of the second Flip-Flop 332 is connected to the output 360 of the second delay line 325. The data inputs of the first and second Flip-Flops 331 and 332 are set to the second logic level (1). The output Q of the first and second Flip-Flops 331 and 332 are the inputs tot he AND gate 333. The output of the AND gate 333 is connected through the buffers 334a 334b to the clear CLR inputs of the first and second Flip-Flops 331 and 332.

The output Q of the first Flip-Flop 331 is the delay signal 370. When the output of the first delay line 315 switches to the second logic level (1), the output Q first Flip-Flop 331 become the second logic level (1). The output Q first Flip-Flop 331 will remain at the second logic level (1) until the output of the second delay line 325 switches to the second logic level (1). The output Q second Flip-Flop 332 will switch to the second logic level (1). The AND gate 333 will then switch to the second logic level (1), thus causing the outputs Q of the first and second Flip-Flops 331 332 to return to the first logic level (0). The time that the delay signal is at the second logic level represents the actual difference in delay from the first clock 340 and the delayed clock 360.

The output 340 of the first delay line 315 will be the input to the sequencer 335. The sequencer 335 will be as described in FIG. 2. The output timing signals 345 of the sequencer 335 are as shown in FIG. 4. The frequency of the first clock CLK will be divided by a factor of four. The first timing signal $S_0$ will be at the second logic level (1) during the first quarter period and at the first logic level (0) for the remaining three quarter periods. The second timing signal $S_1$ will be at the second logic level (1) during the second quarter period and at the first logic level (0) for the remaining three quarter periods. The third timing signal $S_2$ will be at the second logic level (1) during the third quarter period and at the first logic level (0) for the remaining three quarter periods. The fourth timing signal S3 will be at the second logic level (1) during the fourth quarter period and at the first logic level (0) for the remaining three quarter periods.

Referring now back to FIG. 3, the delay signal DL 370 and the timing signals 345 are the inputs of the time-to-voltage converter 350. The time-to-voltage converter is the phase correction calculator 250a, ..., 250b of FIG. 2. The phase correction signals 352 and 354 will be voltage levels. The difference of the voltage levels of the phase correction signals 352 and 354 indicate the error between the actual delay of the second delay line 325 and the desired delay needed to create the delay time d of FIG. 1f.

Figure 6:
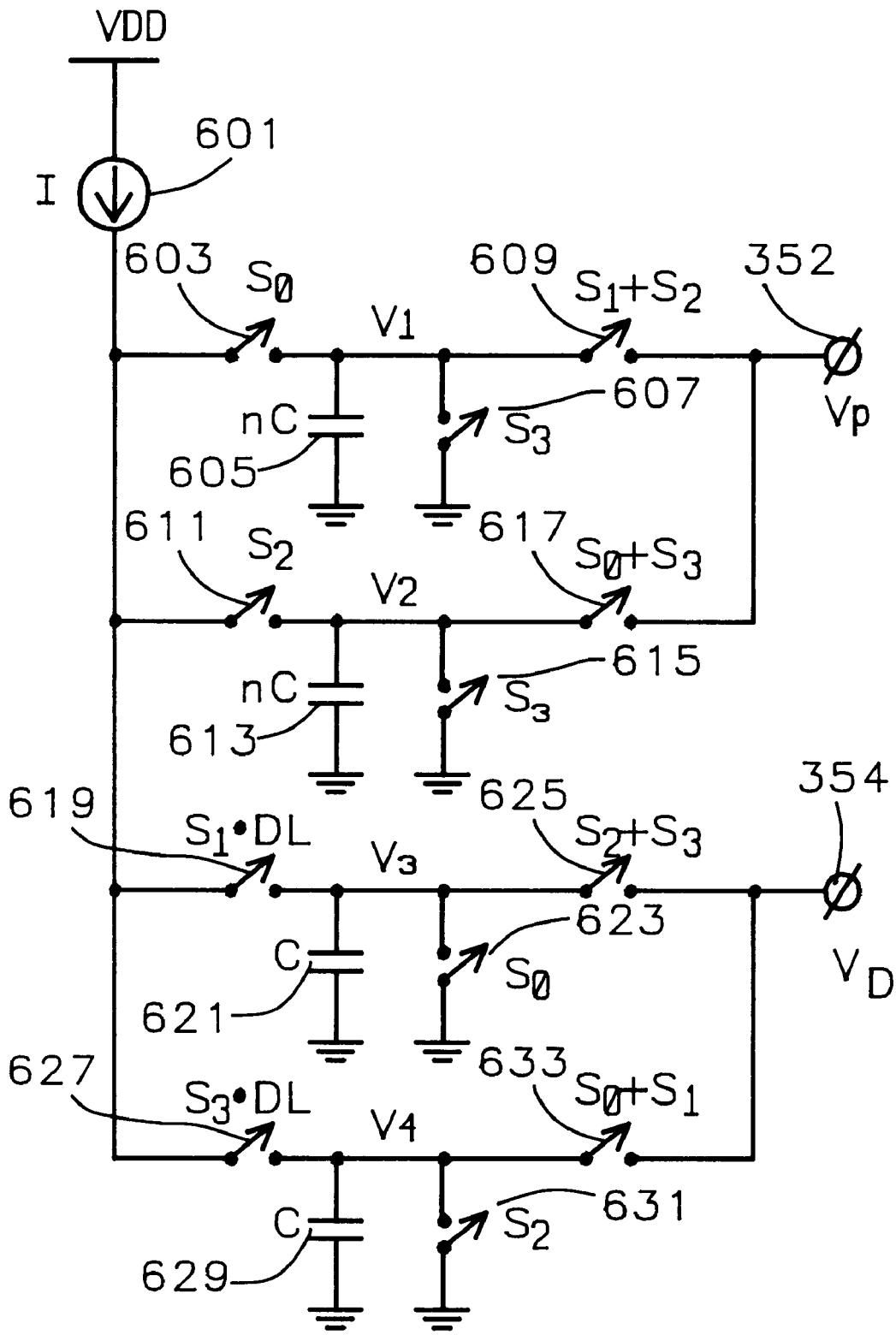
FIG. 6 is a schematic diagram of the phase correction calculator of a fractional period delay clock generation circuit of this invention.

Refer now to FIG. 6 to understand the operation of the time-to-voltage converter 350 and how the phase correction signals 352 and 354 are generated. The time-to-voltage converter has four capacitors 605, 613, 621, and 629. Two of the capacitors 621 and 629 will have a capacitance C, while the other two capacitors 605 and 613 will have a capacitance n×C where n is the fractional value of the period the first clock CLK that is to be the delay. That is the delay is:

$$d = \frac{T}{n}$$

where:

d is the delay from the first clock CLK and the delayed clock CLKD.

T is the period of the first clock CLK.

n is a noninteger fraction of the clock period that is to be the delay.

Four switches 603, 611, 619, and 627 will selectively couple each of the four capacitors 605, 613, 621, and 629 to the current source 601. Four other switches 607, 615, 623, and 631 will selectively couple the four capacitors 605, 613, 621, and 629 to the ground reference point. Two more switches 609 and 617 will selectively couple the capacitors 605, and 613 to the phase correction signals voltage levels $V_P$ 352 and the two switches 625 and 633 will selectively couple the capacitors 621 and 629 to the phase correction signal $V_D$ 354.

The switch 603 will be activated to couple the current source 601 to the capacitor 605 during the period that the timing control signal $S_0$ is at the second logic level (1). This will allow the capacitor to charge to a voltage that is equal to $$V_1 = \frac{IT}{nC}$$

where:

$V_1$ is the voltage on the first plate of the capacitor 605.

I is the current in the constant current source 601.

T is the period of the first clock 340 of FIG. 3.

nC is the capacitance of the capacitor 605.

The switch 611 will be activated to couple the current source 601 to the capacitor 613 during the period that the timing control signal $S_2$ is at the second logic level (1). This will allow the capacitor to charge to a voltage that is equal to $$V_2 = \frac{IT}{nC}$$

where:

$V_2$ is the voltage on the first plate of the capacitor 613.

I is the current in the constant current source 601.

T is the period of the first clock 340 of FIG. 3.

nC is the capacitance of the capacitor 613.

The switch 619 will be activated to couple the current source 601 to the capacitor 621 during the period of time when the logical AND of the timing control signal $S_1$ and the delay signal DL is at the second logic level (1). This will allow the capacitor to charge to a voltage that is equal to $$V_3 = \frac{Id}{C}$$

where:

$V_3$ is the voltage on the first plate of the capacitor 621.

I is the current in the constant current source 601.

T is the period of the first clock 340 of FIG. 3.

d is the delay as above described.

C is the capacitance of the capacitor 621.

The switch 627 will be activated to couple the current source 601 to the capacitor 629 during the period of time when the logical AND of the timing control signal $S_3$ and the delay signal DL is at the second logic level (1). This will allow the capacitor to charge to a voltage that is equal to $$V_4 = \frac{Id}{C}$$

where:

$V_4$ is the voltage on the first plate of the capacitor 629.

I is the current in the constant current source 601.

T is the period of the first clock 340 of FIG. 3.

d is the delay as above described.

C is the capacitance of the capacitor 629.

The capacitors 605, 613, 621, and 629 will be respectively coupled to the ground reference point by switches 607, 615, 623, and 631 to discharge the capacitors 605, 613, 621, and 629 during the respective control periods $S_3$, $S_1$, $S_0$, and $S_2$.

The switch 609 will couple the capacitor 605 to the phase correction signal $V_p$ 352 during periods of time when the timing control signals $S_1$ and $S_2$ are at the second logic level (1). The switch 617 will couple the capacitor 613 to the phase correction signal $V_p$ 352 during periods of time when the timing control signals $S_0$ and $S_3$ are at the second logic level (1). The switch 625 will couple the capacitor 621 to the phase correction signal $V_D$ 354 during periods of time when the timing control signals $S_2$ and $S_3$ are at the second logic level (1). And the switch 633 will couple the capacitor 629 to the phase correction signal VD 354 during periods of time when the timing control signals $S_0$ and $S_1$ are at the second logic level (1).

Figure 7A:
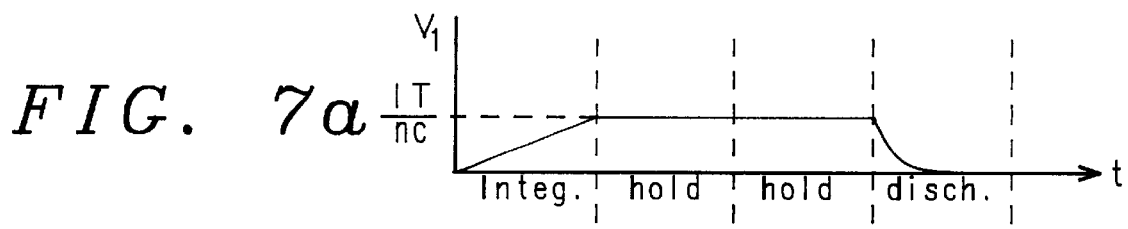
FIGS. 7a–7f are timing diagrams of the phase correction calculator of a fractional period delay clock generation circuit of this invention.

Referring now to FIGS. 7a–7e, to understand the timing of the switching of the time-to-voltage converter. FIG. 7a shows the voltage at point $V_1$ of FIG. 6. During time $t_0$, the switch 603 is activated and capacitor 605 is being charged by the constant current source 601 to the level $$V_1 = \frac{IT}{nC}$$

as described above. During periods $t_1$ and $t_2$, the switch 603 is opened and switch 609 is closed coupling the voltage $V_o$ to the phase correction signal $V_p$ as shown in FIG. 7f. During the time period $t_3$, the switch 609 is opened and switch 607 is closed discharging the capacitor 605.

Figure 7B:
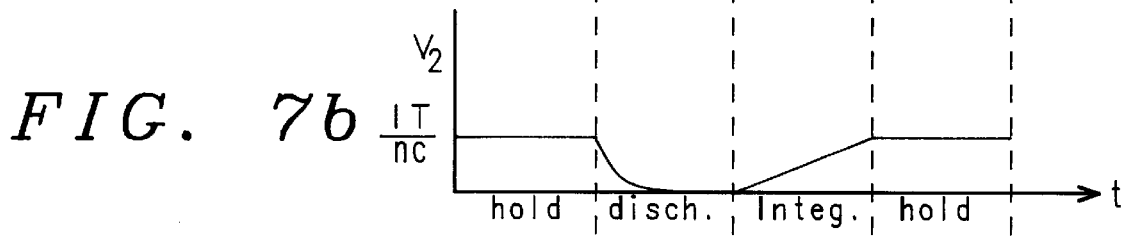

FIG. 7b shows the voltage at point $V_1$ of FIG. 6. During time $t_2$ the switch 611 is activated and capacitor 613 is being charged by the constant current source 601 to the level $$V_2 = \frac{IT}{nC}$$

as described above. During periods $t_3$ and $t_0$ the switch 611 is opened and switch 617 is closed coupling the voltage $V_1$ to the phase correction signal $V_p$ as shown in FIG. 7f. During the time period $t_1$, the switch 617 is opened and switch 615 is closed discharging the capacitor 613.

Figure 7C:
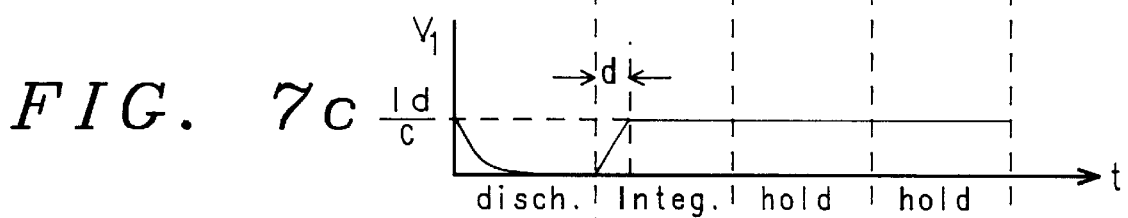

FIG. 7c shows the voltage at point $V_2$ of FIG. 6. During time $t_3$ the switch 619 is activated and capacitor 621 is being charged by the constant current source 601 to the level $$V_3 = \frac{Id}{C}$$

as described above. During periods $t_2$ and $t_3$, the switch 619 is opened and switch 625 is closed coupling the voltage $V_2$ to the phase correction signal $V_D$ as shown in FIG. 7e. During the time period $t_2$, the switch 625 is opened and switch 623 is closed discharging the capacitor 621.

Figure 7D:
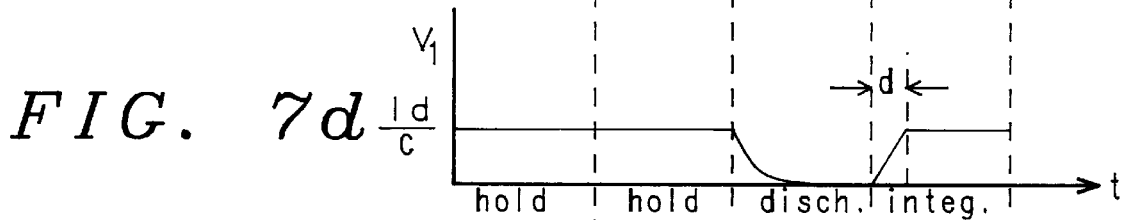
Figure 7E:
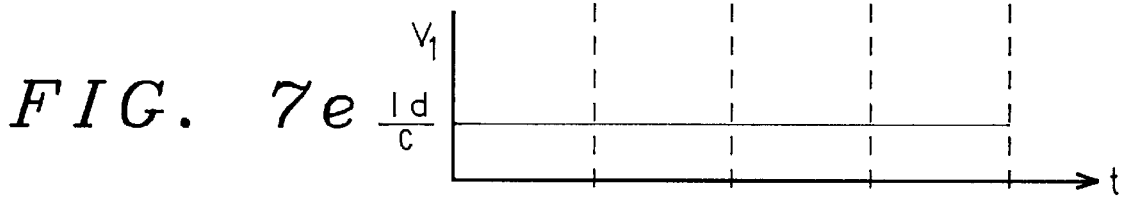
Figure 7F:
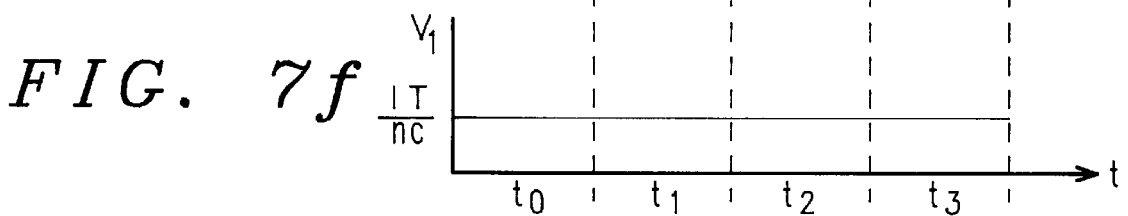

FIG. 7d shows the voltage at point $V_3$ of FIG. 6. During time $t_1$ the switch 627 is activated and capacitor 629 is being charged by the constant current source 601 to the level $$V_4 = \frac{Id}{C}$$

as described above. During periods $t_0$ and $t_1$ the switch 627 is opened and switch 633 is closed coupling the voltage $V_2$ to the phase correction signal VD as shown in FIG. 7e. During the time period t3, the switch 633 is opened and switch 631 is closed discharging the capacitor 629.

Returning now to FIG. 3, the difference in the voltages of the phase correction signals $V_P$ 353 and $V_D$ 354 will indicate the error in the delay between the actual delay and desired delay for the first clock 340 and the delayed clock 360.

The phase correction signals $V_P$ 352 and $V_D$ 354 will be the inputs to the phase adjustment circuit 355. The purpose of the phase adjustment circuit 353 is to adjust the delay of the second delay line 325 such that the phase correction signals are equal. That is:

$$V_D = \frac{Id}{C} \text{ and}$$

$$V_P = \frac{IT}{nC}$$

If the $V_D = V_P$ then:

$$\frac{Id}{C} = \frac{IT}{nC}$$

$$d = \frac{T}{n}.$$

The phase correction circuit 355 is a transconductance amplifier that will provide the phase adjustment signal 365 to adjust the current to the second delay line as above described.

Figure 8:
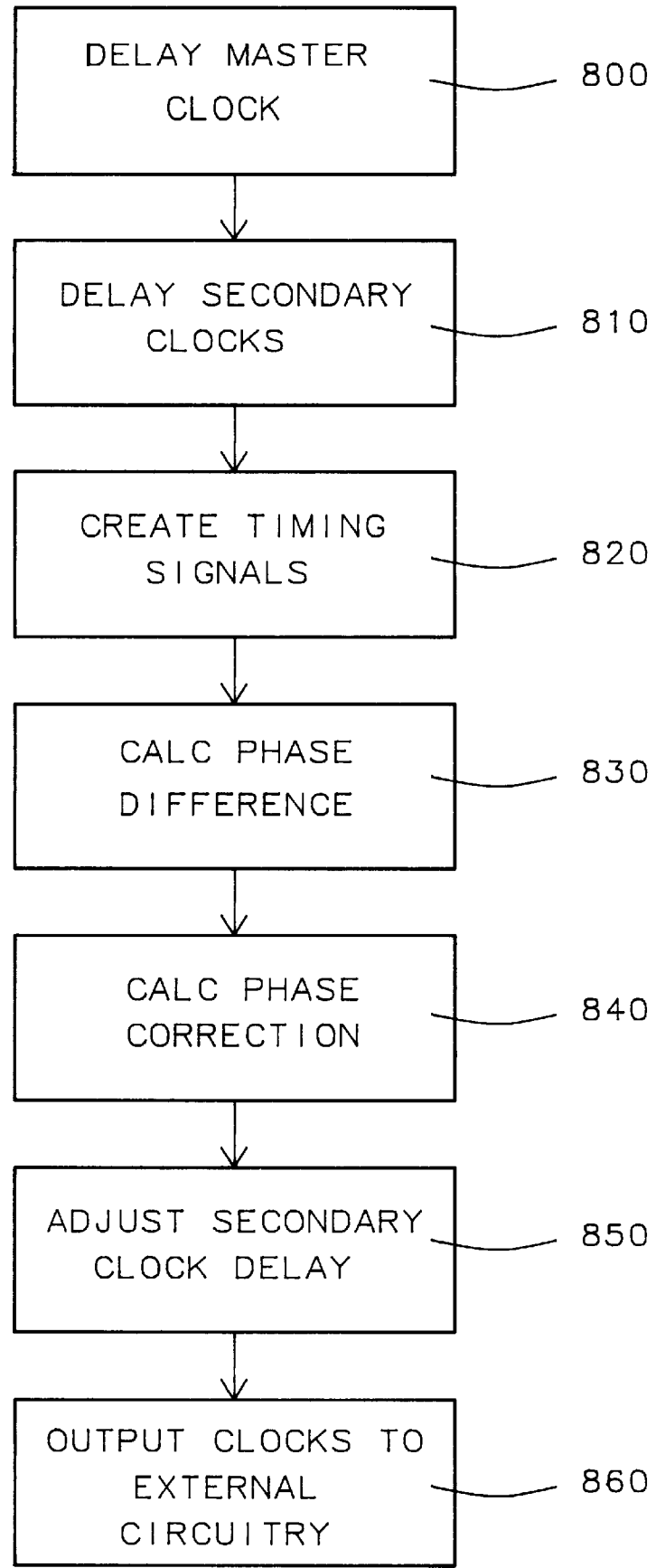
FIG. 8 is a flow diagram of the method to generate fractional period delay clocks.

Refer now to FIG. 8 for a description of a generalized method to create clocks that are delayed by a fractional amount with respect to a primary clock. A master clock is delayed 800 to form the primary clock. The secondary clocks are delayed 810 with respect to the master clock.

A series of timing signals will be created 820. These timing signal will be used to calculate the desired delays of the secondary clocks from the primary clock. The actual phase differences between the secondary clocks and the primary clock will be calculated 830.

The timing signals and the actual phase differences will be manipulated to calculate 840 the amount of phase correction needed to adjust the delay of the secondary clocks to create the desired delay between the primary clock and the secondary clocks. The delay of the secondary clocks will be adjusted 850 and the primary and secondary clocks will be transferred 860 to external circuitry.

While this invention has been particularly shown and described with reference to the preferred embodiments thereof, it will be understood by those skilled in the art that various changes in form and details may be made without departing from the spirit and scope of the invention.

What is claimed is:

1. A fractional period delay circuit to provide a plurality of delayed timing signals, wherein each delayed timing signal is delayed from a first timing signal by any predetermined fraction of a period of said first timing signal, comprising:
   a) a first delay line having an input connected to a master timing signal, a delay circuit connected to the input to delay the master timing signal to form the first timing signal, and an output connected to the delay circuit to transfer said first timing signal to subsequent circuitry:
   b) a plurality of adjustable delay lines, wherein each adjustable delay line has an input connected to said master timing signal, an adjustable delay circuit to delay the master timing signal, a delay adjustment input connected to the adjustable delay circuit to modify a delay parameter of said adjustable delay circuit, and an output connected to the adjustable delay circuit to transfer said one delayed timing signal to subsequent circuitry;
   c) a plurality of phase difference detectors, wherein each phase difference detector has a first input connected to the output of the first delay line, a second input connected to the output of one of the plurality of adjustable delay lines, a difference circuit to create a difference signal indicating a difference in phase between the first timing signal and a delayed timing signal, and an output to transfer the difference signal;
   d) a timing sequence generator connected to the output of the first delay line to create a plurality of sequence timing signals;
   e) a plurality of phase correction calculators, wherein each phase correction calculator is connected to one of the plurality of phase difference detectors and the timing sequence generators to calculate a delay adjustment signal that will maintain a correct delay signal indicating an error between the one delay timing signal and the first timing signal; and
   f) a plurality of delay line adjustment circuits, wherein each delay line adjustment circuit is connected to one of the plurality of phase correction calculators and to the delay adjustment input of one of the adjustable delay lines to adjust the delay of said adjustable delay line such that the one delay timing signal is correctly delayed with respect to said first timing signal.

2. The circuit of claim 1 wherein the first timing signal and the plurality of timing signals are clocking signals for digital circuitry from the set of digital circuitry consisting of microprocessors and digital signal processors.

3. The circuit of claim 1 wherein a delay time of the first delay line and each of the plurality of adjustable delay lines is controlled by a constant current source.

4. The circuit of claim 1 wherein the plurality of phase difference detectors each comprises:
   a) a first flip-flop having a first input connected to the output of the first delay line, a first data output that will assume a first logic state for a period of time indicating a difference in phase between the first timing signal and the delayed timing signal, whereby said first data output is the difference signals, and a first clear input to set said first output to a second logic state, when said clear input is at the first logic state;
   b) a second flip-flop having a second input connected to one of the outputs of one of the plurality of adjustable delay lines, a second output that will assume the first logic state when the clock input assumes the first logic state, and a second clear input to set said second output to the second logic state when said second clear input is at the first logic state; and
   c) a difference logic circuit having a first input connected to the first output of said first flip-flop and a second input connected to the second output of said second flip-flop, an logic output connected to the first and second clear inputs, whereby said logic output assume the first logic state when the first and second inputs both have assumed the first logic state.

5. The circuit of claim 1 wherein the plurality of sequence timing signals comprise:
   a) a first sequence timing signal having a first logic state during a first cycle of a four cycle set of first timing signals and second logic state during a second, third, and fourth cycle of the four cycle set of first timing signals;
   b) a second sequence timing signal having the first logic state during the second cycle of a four cycle set of first timing signals and the second logic state during the first, third, and fourth cycle of the four cycle set of first timing signals;

c) a third sequence timing signal having the first logic state during the third cycle of a four cycle set of first timing signals and the second logic state during the first, second, and fourth cycle of the four cycle set of first timing signals; and d) a fourth sequence timing signal having the first logic state during a fourth cycle of a four cycle set of first timing signals and the second logic state during the first, second, and third cycle of the four cycle set of first timing signals.

6. The circuit of claim 1 wherein each of the phase correction calculators is time-to-voltage converter, whereby:

a) a first phase correction voltage is generated that is proportional to a period of time of the first timing signal and proportional to the fractional period; and b) a second phase correction voltage generated that is proportional to a time of said difference signal.

7. The circuit of claim 6 wherein each time-to-voltage converter comprises:

a) a first output terminal to transfer the first phase correction voltage to one of the delay adjustment circuits b) a second output terminal to transfer the second phase correction voltage to one of the delay adjustment circuits;

c) a constant current source coupled to a power supply voltage source;

d) a first capacitor having a first plate connected to the ground reference point;

e) a first switch to selectively couple the constant current source to a second plate of the first capacitor as determined by a first one of the plurality of sequence timing signals;

f) a second switch to selectively couple the second plate of the first capacitor to the ground reference point as determined by a second one of the plurality of sequence timing signals;

g) a third switch to selectively couple the second plate of the first capacitor to the first output terminal to transfer said first phase correction voltage from said second plate as determined by a first pair of the sequence of timing signals;

h) a second capacitor having a first plate connected to the ground reference point;

i) a fourth switch to selectively couple the constant current source to a second plate of the second capacitor as determined by a fourth one of the plurality of sequence timing signals;

j) a fifth switch to selectively couple the second plate of the second capacitor to the ground reference point as determined by a fifth one of the plurality of the sequence timing signals;

k) a sixth switch to selectively couple the second plate of the second capacitor to the first output terminal to transfer said first phase correction voltage from said second plate as determined by a second pair of the sequence of timing signals;

l) a third capacitor having a first plate connected to the ground reference point;

m) a seventh switch to selectively couple the constant current source to a second plate of the third capacitor as determined by a seventh one of the plurality of sequence timing signals logically AND'ed with the difference signal;

n) a eighth switch to selectively couple the second plate of the third capacitor to the ground reference point as determined by a eighth one of the plurality of the sequence timing signals;

o) a ninth switch to selectively couple the second plate of the third capacitor to the second output terminal to transfer said second phase correction voltage from said second plate as determined by a third pair of the sequence of timing signals;

p) a fourth capacitor having a first plate connected to the ground reference point;

q) a tenth switch to selectively couple the constant current source to a second plate of the fourth capacitor as determined by a tenth one of the plurality of sequence timing signals logically AND'ed with the difference signal;

r) a eleventh switch to selectively couple the second plate of the third capacitor to the ground reference point as determined by a eleventh one of the plurality of the sequence timing signals; and s) a twelfth switch to selectively couple the second plate of the fourth capacitor to the second output terminal to transfer said second phase correction voltage from said second plate as determined by a fourth pair of the sequence of timing signals.

8. The circuit of claim 1 wherein the delay line adjustment circuit comprises:

a) an adjustable current source whereby said current source provides a modifying current to said delay line to change the delay parameter; and b) a transconductance amplifier to amplify a difference signal within said delay adjustment signal and adjust the adjustable current source to minimize said difference signal.

9. A fractional period delay circuit to provide a plurality of delayed timing signals, wherein each delayed timing signal is delayed form a first timing signal by any predetermined fraction of a period of said first timing signal, comprising:

a) a first delay line having an input connected to a master timing signal, a delay circuit connected to the input to delay the timing signal to form the first timing signal, a first constant current source to establish a first delay timing of said master timing signal to said first timing signal, and an output connected to the delay circuit to transfer said first timing signal to subsequent circuitry:

b) a plurality of adjustable delay lines, wherein each adjustable delay line has an input connected to said master timing signal, an adjustable delay circuit to delay the master timing signal, a delay adjustment input connected to the adjustable delay circuit to modify a delay parameter of said adjustable delay circuit, an adjustable current source to establish a second delay timing of said master timing signal to one of the delayed timing signals, whereby said delay parameter modifies said adjustable current source to change said delay parameter, and an output connected to the adjustable delay circuit to transfer said one delayed timing signal to subsequent circuitry;

c) a plurality of phase difference detectors, wherein each phase difference detector comprises:
a first input connected to the output of the first delay line,
a second input connected to the output of one of the plurality of adjustable delay lines, and a difference circuit to create a difference signal indicating a difference in phase between the first timing signal and the one delayed timing signal, and an output to transfer the difference signal, whereby said difference circuit comprises:

a first flip-flop having a first input connected to the output of the first delay line, a first data output that will assume a first logic state for a period of time indicating a difference in phase between the first timing signal and the delayed timing signal, whereby said first data output is the difference signals, and a first clear input to set said first output to a second logic state, when said clear input is at the first logic state, a second flip-flop having a second clock input connected to one of the outputs of one of the plurality of adjustable delay lines, a second output that will assume the first logic state when the clock input assumes the first logic state, and a second clear input to set said second output to the second logic state when said second clear input is at the first logic state, and a difference logic circuit having a first input connected to the first output of said first flip-flop and a second input connected to the second output of said second flip-flop, an logic output connected to the first and second clear inputs, whereby said logic output assume the first logic state when the first and second inputs both have assumed the first logic state;

d) a timing sequence generator connected to the output of the first delay line to create a plurality of sequence timing signals, whereby said sequence timing signals comprise:

a first sequence timing signal having the first logic state during a first cycle of a four cycle set of first timing signals and second logic state during a second, third, and fourth cycle of the four cycle set of first timing signals, a second sequence timing signal having the first logic state during the second cycle of a four cycle set of first timing signals and second logic state during the first, third, and fourth cycle of the four cycle set of first timing signals, a third sequence timing signal having the first logic state during the third cycle of a four cycle set of first timing signals and second logic state during the first, second, and fourth cycle of the four cycle set of first timing signals, and a fourth sequence timing signal having the first logic state during a fourth cycle of a four cycle set of first timing signals and second logic state during the first, second, and third cycle of the four cycle set of first timing signals;

e) a plurality of phase correction calculators, wherein each phase correction calculator is connected to one of the plurality of phase difference detectors and the timing the timing sequence generators to calculate a delay adjustment signals that will maintain a correct delay signal indicating an error between the one delay timing signal and the first timing signal, whereby said delay adjustment signal comprises:

a first phase correction voltage is generated that is proportional to a period of time of the first timing signal and proportional to the fractional period; and a second phase correction voltage generated that is proportional to a time of said difference signal; and f) a plurality of delay line adjustment circuits, wherein each delay line adjustment circuit is connected to one of the plurality of phase correction calculators and to the delay adjustment input of one of the adjustable delay lines to adjust the delay of said adjustable delay line such that the one delay timing signal is correctly delayed with respect to said first timing signal, whereby each of the plurality of delay line adjustment circuits is a transconductance amplifier to amplify a difference signal within said delay adjustment signal and adjust the adjustable current source to minimize said difference signal.

10. The circuit of claim 9 wherein the first timing signal and the plurality of timing signals are clocking signals for digital circuitry from the set of digital circuitry including microprocessor and digital signal processors.

11. The circuit of claim 9 wherein the first and second phase correction voltages are created in a time-to-voltage converter whereby said time-to-voltage converter comprises:

a) a first output terminal to transfer the first phase correction voltage to one of the delay adjustment circuits b) a second output terminal to transfer the second phase correction voltage to one of the delay adjustment circuits;

c) a constant current source coupled to a power supply voltage to source;

d) a first capacitor having a first plate connected to the ground reference point;

e) a first switch to selectively couple the constant current source to a second plate of the first capacitor as determined by the first sequence timing signal;

f) a second switch to selectively couple the second plate of the first capacitor to the ground reference point as determined by the fourth sequence timing signal;

g) a third switch to selectively couple the second plate of the first capacitor to the first output terminal to transfer said first phase correction voltage from said second plate as determined by the second and third sequence of timing signals;

h) a second capacitor having a first plate connected to the ground reference point;

i) a fourth switch to selectively couple the constant current source to a second plate of the second capacitor as determined by the third sequence timing signal;

j) a fifth switch to selectively couple the second plate of the second capacitor to the ground reference point as determined by the second sequence timing signal;

k) a sixth switch to selectively couple the second plate of the second capacitor to the first output terminal to transfer said first phase correction voltage from said second plate as determined by the first and fourth sequence of timing signals;

l) a third capacitor having a first plate connected to the ground reference point;

m) a seventh switch to selectively couple the constant current source to a second plate of the third capacitor as determined by the second sequence timing signal logically AND'ed with the difference signal;

n) a eighth switch to selectively couple the second plate of the third capacitor to the ground reference point as determined by the first sequence timing signals;

o) a ninth switch to selectively couple the second plate of the third capacitor to the second output terminal to transfer said second phase correction voltage from said second plate as determined by the third and fourth sequence of timing signals;

p) a fourth capacitor having a first plate connected to the ground reference point;

q) a tenth switch to selectively couple the constant current source to a second plate of the fourth capacitor as determined by the fourth sequence timing signal logically AND'ed with the difference signal;

r) a eleventh switch to selectively couple the second plate of the third capacitor to the ground reference point as determined by the third sequence timing signals; and s) a twelfth switch to selectively couple the second plate of the fourth capacitor to the second output terminal to transfer said second phase correction voltage from said second plate as determined by the first and second sequence of timing signals.

12. A method for delaying a plurality of secondary timing signals with respect to a primary timing signal for a plurality of predetermined fractional delay periods of said primary timing signal, comprising the steps of:

a) delaying a master timing signal by a first delay period to form said primary timing signal;

b) delaying said master timing signal by a plurality of secondary delay periods to form said plurality of secondary timing signals;

c) creating a plurality of control timing signals having a plurality of sequence timing signals whereby each sequence timing signal indicates one cycle of multiple cycles of said primary timing signal;

d) calculating a phase difference between said primary timing signal and each of the plurality of secondary timing signals;

e) calculating a phase correction factor from the control timing signals and the phase difference of each of the plurality of secondary timing signals;

f) modifying each of the plurality of secondary delay periods as a function of the phase correction factor to maintain each secondary delay period at each of the fractional delay periods; and g) repeating the aforementioned steps to maintain the plurality of secondary delay periods, while transferring said first timing signal and the plurality of secondary timing signals to external circuitry.

13. The method of claim 12 wherein the primary timing signal and the plurality of secondary timing signals are clocking signals for digital circuitry from the set of digital circuitry consisting of microprocessors and digital signal processors.

14. The method of claim 12 wherein a primary delay period and each of the plurality of secondary delay periods is accomplished by a silicon delay line that is controlled by a constant current source.

15. The method of claim 12 wherein the phase difference for each of the plurality of secondary timing signals is determined by a plurality of phase difference detectors whereby each phase difference detector comprises:

a) a first flip-flop having a first input connected to the output of the first delay line, a first data output that will assume a first logic state for a period of time indicating a difference in phase between the first timing signal and the delayed timing signal, whereby said first data output is the difference signals, and a first clear input to set said first output to a second logic state, when said clear input is at the first logic state;

b) a second flip-flop having a second input connected to one of the outputs of one of the plurality of adjustable delay lines, a second output that will assume the first logic state when the clock input assumes the first logic state, and a second clear input to set said second output to the second logic state when said second clear input is at the first logic state; and c) a difference logic circuit having a first input connected to the first output of said first flip-flop and a second input connected to the second output of said second flip-flop, an logic output connected to the first and second clear inputs, whereby said logic output assume the first logic state when the first and second inputs both have assumed the first logic state.

16. The method of claim 12 wherein creating the plurality of control timing signals comprise:

a) a first sequence timing signal having a first logic state during a first cycle of a four cycle set of first timing signals and a second logic state during a second, third, and fourth cycle of the four cycle set of first timing signals;

b) a second sequence timing signal having the first logic state during the second cycle of a four cycle set of first timing signals and the second logic state during the first, third, and fourth cycle of the four cycle set of first timing signals;

c) a third sequence timing signal having the first logic state during the third cycle of a four cycle set of first timing signals and the second logic state during the first, second, and fourth cycle of the four cycle set of first timing signals; and d) a fourth sequence timing signal having the first logic state during a fourth cycle of a four cycle set of first timing signals and the second logic state during the first, second, and third cycle of the four cycle set of first timing signals.

17. The method of claim 12 wherein calculating the phase correction factor is accomplished in a phase correction calculator which is a time-to-voltage converter, whereby:

a) a first phase correction voltage is generated that is proportional to a period of time of the first timing signal and proportional to the fractional period; and b) a second phase correction voltage generated that is proportional to a time of said difference signal.

18. The method of claim 17 wherein each time-to-voltage converter comprises:

a) a first output terminal to transfer the first phase correction voltage to one of the delay adjustment circuits b) a second output terminal to transfer the second phase correction voltage to one of the delay adjustment circuits;

c) a constant current source coupled to a power supply voltage source;

d) a first capacitor having a first plate connected to the ground reference point;

e) a first switch to selectively couple the constant current source to a second plate of the first capacitor as determined by a first one of the plurality of sequence timing signal;

f) a second switch to selectively couple the second plate of the first capacitor to the ground reference point as determined by a second one of the plurality of sequence timing signals;

g) a third switch to selectively couple the second plate of the first capacitor to the first output terminal to transfer said first phase correction voltage from said second plate as determined by a first pair of the sequence of timing signals;

h) a second capacitor having a first plate connected to the ground reference point;

i) a fourth switch to selectively couple the constant current source to a second plate of the second capacitor as determined by a fourth one of the plurality of sequence timing signals;

j) a fifth switch to selectively couple the second plate of the second capacitor to the ground reference point as determined by a fifth one of the plurality of the sequence timing signals;

k) a sixth switch to selectively couple the second plate of the second capacitor to the first output terminal to transfer said first phase correction voltage from said second plate as determined by a second pair of the sequence of timing signals;

l) a third capacitor having a first plate connected to the ground reference point;

m) a seventh switch to selectively couple the constant current source to a second plate of the third capacitor as determined by a seventh one of the plurality of sequence timing signals logically AND'ed with the difference signal.

n) a eighth switch to selectively couple the second plate of the third capacitor to the ground reference point as determined by a eighth one of the plurality of the sequence timing signals;

o) a ninth switch to selectively couple the second plate of the third capacitor to the second output terminal to transfer said second phase correction voltage from said second plate as determined by a third pair of the sequence of timing signals;

p) a fourth capacitor having a first plate connected to the ground reference point;

q) a tenth switch to selectively couple the constant current source to a second plate of the fourth capacitor as determined by a tenth one of the plurality of sequence timing signals logically AND'ed with the difference signal;

r) a eleventh switch to selectively couple the second plate of the third capacitor to the ground reference point as determined by a eleventh one of the plurality of the sequence timing signals; and s) a twelfth switch to selectively couple the second plate of the fourth capacitor to the second output terminal to transfer said second phase correction voltage from said second plate as determined by a fourth pair of the sequence of timing signals;

t) The method of claim 12 wherein modifying the plurality of secondary delay periods is accomplished in a delay line adjustment circuit.

\* \* \* \* \*